United States Patent
Eaton, Jr. et al.

(10) Patent No.: US 6,927,996 B2
(45) Date of Patent: Aug. 9, 2005

(54) MAGNETIC MEMORY DEVICE

(75) Inventors: James R. Eaton, Jr., Palo Alto, CA (US); Kenneth J. Eldredge, Boise, ID (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 140 days.

(21) Appl. No.: 10/676,465

(22) Filed: Sep. 30, 2003

(65) Prior Publication Data

US 2005/0068830 A1 Mar. 31, 2005

(51) Int. Cl.$^7$ ............................................. G11C 11/14
(52) U.S. Cl. ..................... 365/171; 365/204; 365/232; 327/309; 327/314

(58) Field of Search .................................. 365/171, 204, 365/232; 327/309

(56) References Cited

U.S. PATENT DOCUMENTS 3,751,681 A * 8/1973 Jordan, Jr. .................... 326/26
2005/0042825 A1 * 2/2005 Kitamura et al. ............ 438/257

* cited by examiner

*Primary Examiner*—Anh Phung
*Assistant Examiner*—N Nguyen

(57) ABSTRACT

A magnetic random access memory (MRAM) includes an array of magnetic memory cells arranged on a cross-point grid. Spurious voltages that build up on the stray wiring capacitance of unselected bit and word select lines are limited and discharged by diodes. The control of such spurious voltages improves device operating margins and allows the construction of larger arrays.

8 Claims, 2 Drawing Sheets

MAGNETIC MEMORY DEVICE

FIELD OF THE INVENTION

The present invention relates to magnetic memory devices, and more specifically to using diodes to discharge floating row and column address lines in magnetic memory devices to improve operating margins.

BACKGROUND OF THE INVENTION

Non-volatile magnetic random access memory (MRAM) devices can replace volatile dynamic random access memory (DRAM) devices and static random access memory (SRAM) devices in some applications. MRAM devices use arrays of cells based on tunneling magneto-resistance (TMR), colossal magneto-resistance (CMR), and giant magneto-resistance (GMR) technology.

MRAM cells are typically structured around "data" and "reference" layers. The data layer includes a writeable or switchable magnetic material, and the reference layer includes a fixed magnetic material. A dielectric layer in between the two has greater or lesser resistance to electrical current depending on whether the magnetic fields from the sandwiching outer layers are canceling or reinforcing one another.

During a write operation, the magnetization of the data layer can be switched between two opposite states by applying an electro-magnetic field through a nearby wire loop. Thus binary information can be stored. The reference layer usually comprises a magnetic material in which the magnetization is pinned. A magnetic field applied to the data layer penetrates the reference layer with insufficient strength to switch the magnetization in the reference layer.

For example, in a TMR cell, the data layer and the reference layer are separated by a thin dielectric layer so that a tunneling junction is formed. The probability that electrons will be able to tunnel through the dielectric layer depends on the direction of the magnetization in the data layer relative to the direction of the magnetization in the reference layer. Therefore, the structure is "magneto-resistant" and information can be stored and retrieved by reading the magnitude of tunneling currents thereafter able to pass through the memory cell.

Magnetic memory devices usually comprise a large number of such magnetic memory cells arranged in rows and columns of an array. The magnetic memory cells are sandwiched between word and bit and word lines. For example, the magnetic memory cells of each row are connected by bit lines and the magnetic memory cells of each column are connected by word lines. The bit lines are suitable to carry the write current required to generate the magnetic field to switch the magnetic memory cells.

Read and write operations are performed selectively, that is one or more magnetic memory cells are selected for a read or write operation by selecting respective lines. For reliable operation of the device it is desirable to have consistent electrical read and write limits for all magnetic memory cells of the array.

SUMMARY OF THE INVENTION

Briefly, a magnetic random access memory (MRAM) embodiment of the present invention comprises an array of magnetic memory cells. The magnetic memory cells are connected to wires and are selectable by electrically selecting of the wires. The device also comprises voltage clamp connected to wire so as to limit residual voltage if the wire is unselected.

The invention will be more fully understood from the following description of embodiments of the invention. The description is provided with reference to the accompanying drawings.

DETAILED DESCRIPTION OF A EMBODIMENTS

Figure 1:
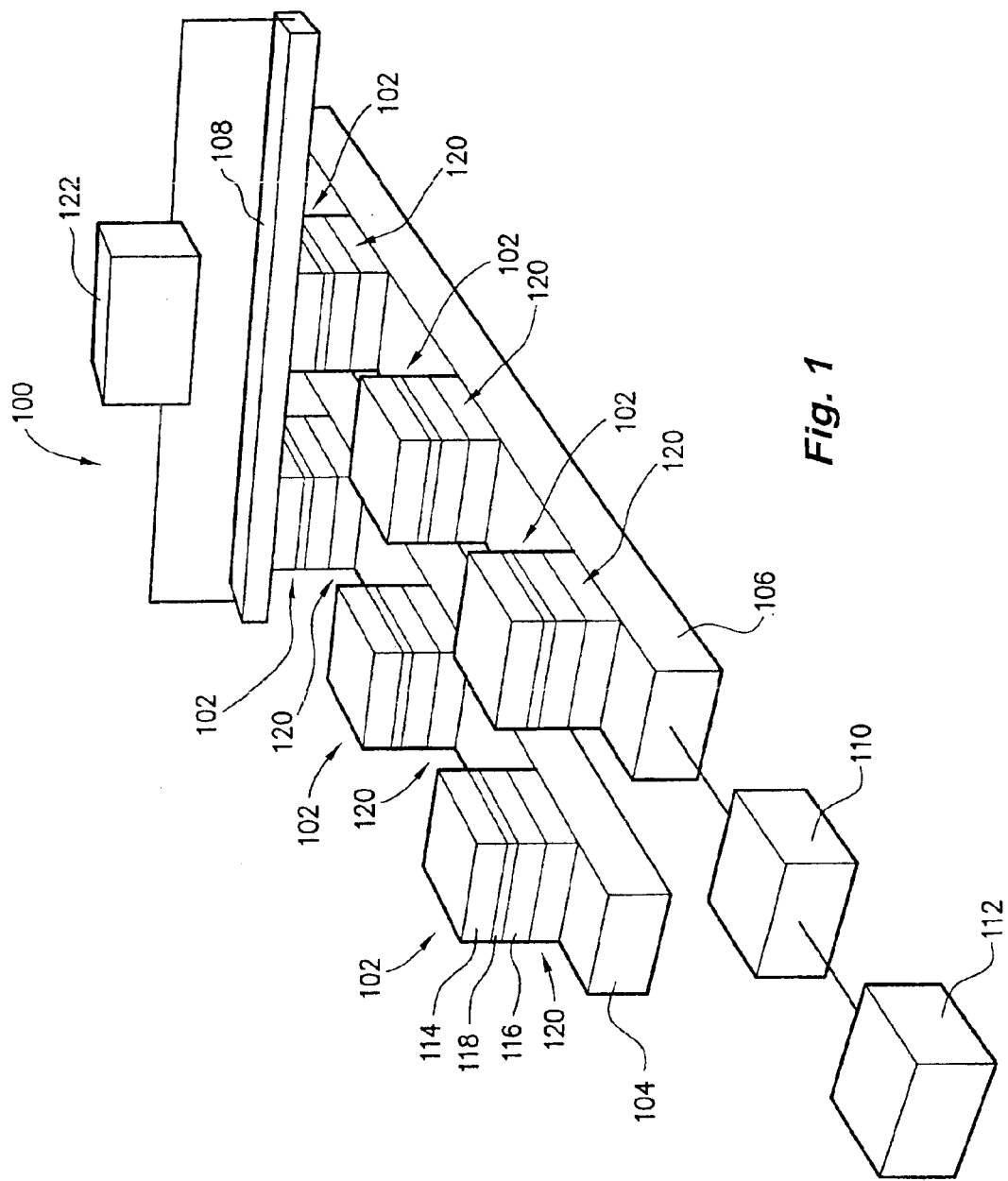
FIG. 1 is a perspective diagram of a magnetic memory device embodiment of the present invention.

FIG. 1 represents a magnetic random access memory (MRAM) embodiment of the present invention, and is referred to herein by the general reference numeral 100. The MRAM 100 comprises a number of individual magneto-resistance memory cells 102. In this case, each memory cell 102 is based on tunneling magneto resistance memory (TMR) technology. Each cell 102 is electrically connected and addressable by selecting respective word and bit lines. FIG. 1 shows word lines 104 and 106, and for clarity, only one bit line 108 is shown. Each word line is series-connected to a voltage clamp, e.g., a discharge diode 110. For simplicity, only one discharge diode 110 is shown. The MRAM 100 further comprises a voltage-controlled source 112.

Each memory cell 102 includes a magnetic data layer 114 and a magnetic reference layer 116. The reference layer 116 is such that the direction of magnetization is pinned. Data layer 114 uses magnetic material in which the direction of its magnetization is switchable as a function of an applied electro-magnetic field. A dielectric layer 114 is disposed between the data layer 118 and the reference layer 116. Such is thin enough for a tunneling current to flow through it given the proper voltages.

The tunneling probability, and therefore the effective resistance of the memory cell, depends on the direction of the magnetization in data layer 114 relative to that of the reference layer 116. It is therefore possible to store data magnetically, and read back the orientation of the written magnetization in the data layer. The tunneling current is measured, as it is dependent on the resistance of the memory cell 102.

In general, the magnetization in data layer 114 can have two opposing directions. Binary information can be stored as a function of the direction of the magnetic field generated by the current applied to bit line 108.

When a current is applied, a magnetic field will surround bit line 108. Such can be used to switch the magnetization of data layer 114. The magnetic memory cells 102 have finite resistance and a portion of the write current may leak through the cells during a write operation. Such may lead to spurious currents and write-current non-uniformity. To limit this effect, MRAM 100 includes nonlinear current limiting elements which limit the leakage of write currents through the cells. In this example, the non-linear elements are rectifiers, diodes 120.

Diodes 120 may allow a capacitive build-up of electrical charges on unselected lines. The resulting circuit looks like a peak detector. A voltage clamp is used to limit the voltages the unselected lines can rise to. As the voltage clamp limits the residual voltage of the unselected wire, it is possible to reduce the effect of the built-up electrical charges on the read and write limits if previously unselected lines are selected. Therefore possible differences of electrical read and write limits for the magnetic memory cells across the array can be reduced.

For example, the voltage-controlled source 112 outputs a control voltage to diode 110. During write operations, the diodes 110 connected to any unselected wires will be reverse biased, and not load the wire. During write operations, the unselected lines may float charge. After write operations, the voltage source forward biases the diodes and clamps down any charge. The diodes 120 connected to a selected line forward biases during write operations.

FIG. 1 includes a write generator 122 that outputs a write current through bit line 108. The write generator may also generate a current through word lines 104 and 106. For clarity, electrical connections to the write generator 110 are not shown for word lines 104 and 106.

MRAM 100 further includes a read circuit for sensing the resistance of selected memory cells 102 during read operations. During read operations, a constant-voltage supply or a ground is applied to the bit line 108. An external circuit may source the constant-voltage supply. The read circuit is conventional, and not shown in order to simplify the drawing.

MRAM 100 may comprise an array having any number of memory cells 102 arranged in any number of rows and columns. Further, MRAM 100 may use other magnetic memory technologies, such as colossal magneto resistance memory cells (CMR), or giant magneto resistance memory (GMR) cells.

Data layer 114 uses nickel iron, the reference layer 116 includes cobalt iron, and the dielectric layer 118 comprises aluminum dioxide. Such layers have a planar area of approximately 140 nm by 300 nm. The reference layer 116, data layer 114, and the dielectric layer 118 have a thickness of approximately 2 nm, 3.5 nm and 1.2 nm. The circuit resistance of magnetic memory cell 102 is about 1 MΩ. In this example, the word and bit lines 104, 106 and 108 are wired with copper metallizations.

Each magnetic memory cell may comprise a number of additional layers such as capping, AF and seed layers. Further, not all the word lines need be connected to voltage clamps. Voltage clamps may also be connected to the bit lines. Also, one voltage clamp may be associated with a number of bit or word lines.

Discharge diodes 110 are typically located peripheral to the MRAM electronic circuitry. Such diodes may be minimum feature size diodes such as thin film diodes, or they could be N+/P− well diodes in the substrate of the device. Diodes 120 are thin film diodes and each comprise an n-type and p-type regions. In this example, the n-type and p-type regions use doped amorphous silicon. Boron doping is used for p-type and doped with phosphorous or arsenic for n-type. Such are 10–100 nm, and each have a contact area of about 140 nm×300 nm.

Figure 2:
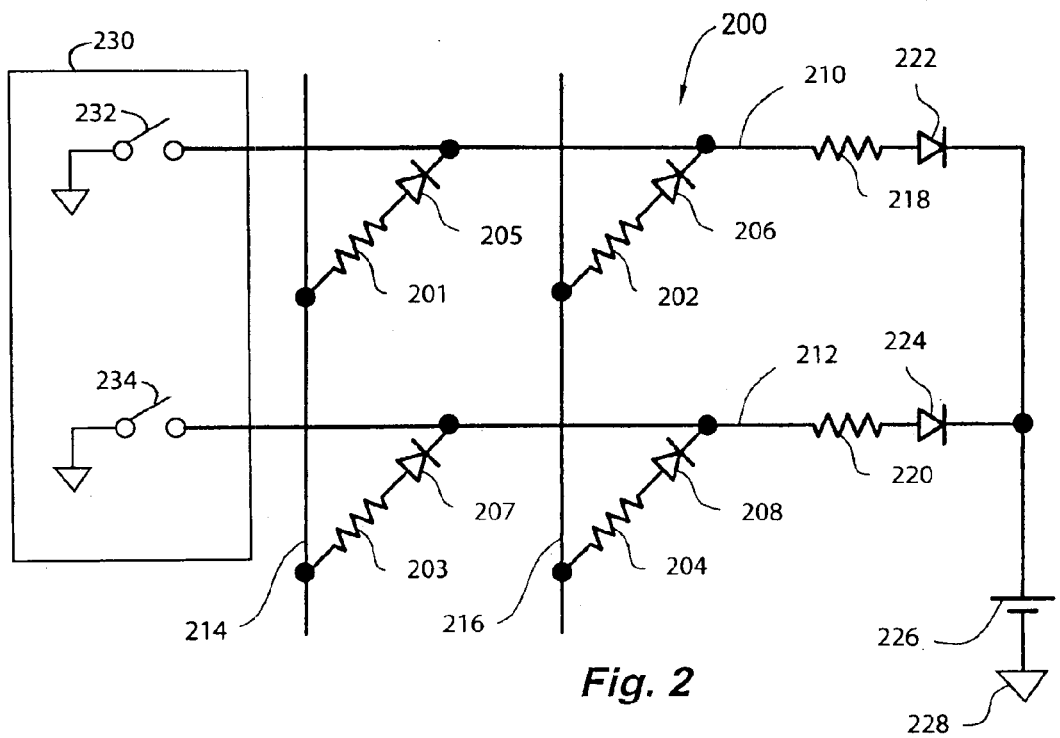
FIG. 2 is a circuit diagram of a magnetic memory device embodiment of the present invention.

FIG. 2 represents an MRAM device embodiment of the present invention, and is referred to herein by general reference numeral 200. MRAM 200 is a 2×2 array of four MRAM cells 201–204 each with a series diode 205–208. Stray currents through unselected cells can be limited by seeing to it that series diodes 205–208 will reverse bias when a word line 210 or 212 is not selected (HIGH). A pair of bit lines 214 and 216 are selected when they go HIGH. So the MRAM cell 201–204 at the intersection of a selected (LOW) word line 210 and 212 and a selected (HIGH) bit line 214 and 216 will present its programmable resistance through a respective forward biased diode 205–208. All the other non-selected MRAM cells 201–204 will have reverse biased series diodes 205–208.

A limiting resistor 218 and 220 in series with a word-line clamping diode 222 and 224 bleeds off floating charges on word lines 210 and 212 that would otherwise build up when a respective row of diodes 205–208 are reverse biased. A voltage source (Vs) 226 is referenced to ground 228 and sets the clamping voltage.

A row-address decoder 230 is represented as having a simple switch output 232 and 234. For example, such would be implemented with open-collector bipolar transistors or open-drain field effect transistors (FET's). It is such high impedance states in the unselected lines that allows charges to build up that can unbalance the write current uniformity across the MRAM 200. A totem-pole output decoder 230 would avoid the floating voltage build up on word lines 210 and 212, but would be costly in terms of the extra number of devices needed to implement such circuitry.

Figure 3:
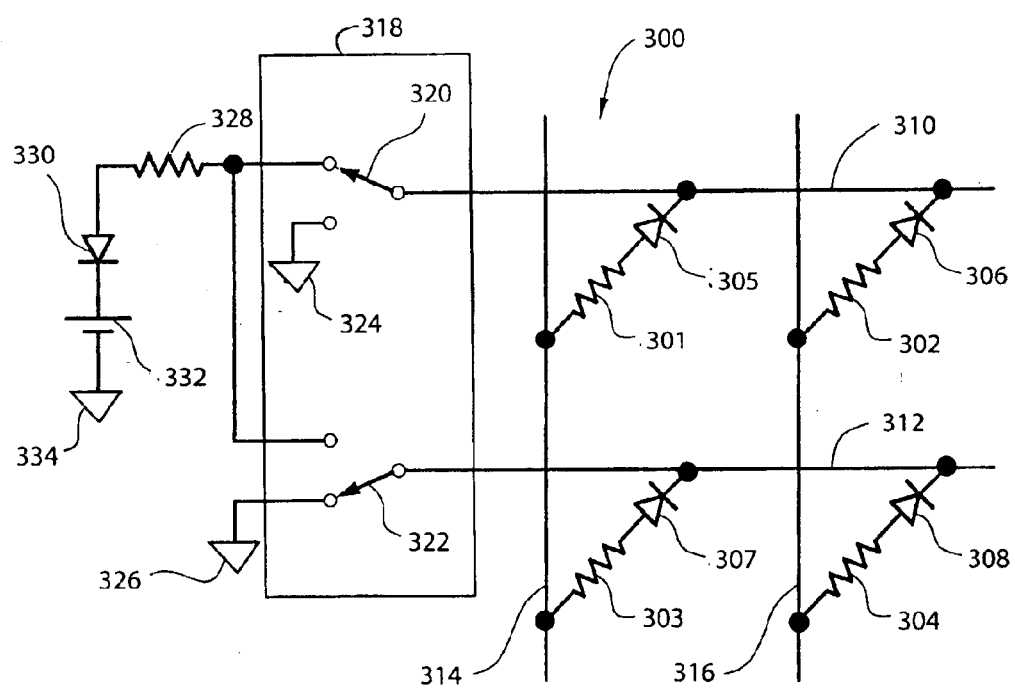
FIG. 3 is a circuit diagram of another a magnetic memory device embodiment of the present invention.

FIG. 3 represents an MRAM device according to another embodiment of the present invention, and is referred to herein by general reference numeral 300. MRAM 300 is a 2×2 array of four MRAM cells 301–304 each with a series diode 305–308. Series diodes 305–308 reverse bias when a word line 310 or 312 is not selected (HIGH). A pair of bit lines 314 and 316 are selected when they go HIGH. Any MRAM cell 301–304 at the intersection of a selected (LOW) word line 310 and 312 and a selected (HIGH) bit line 314 and 316 will present its programmable resistance through a respective forward biased diode 305–308. All the other non-selected MRAM cells 301–204 will have reverse biased series diodes 305–308.

Floating charge build-ups on the unselected word lines 310 and 312 are prevented by a row address decoder 318. Its output structure is represented by two singe-pole, double-throw (SPDT) switches 320 and 322, e.g., a standard CMOS logic totem-pole output. Selected row lines are grounded to either ground 324 and 326. Non-selected row lines are not allowed to float by virtue of being connected to a common discharge resistor 328, diode 330, and voltage source 332 referenced to ground 334. The voltage source 332 can be operated at less than the logic rail voltage, Vcc for example, and is ideally adjusted to suit an equi-potential voltage set by the MRAM cells 301–304.

In one embodiment the device lets unselected word lines to float, but limits that with a plurality of voltage clamps each series-connected to a respective wire. For example, each voltage clamp may be connected to a respective bit or word line of the device. Such allows excess voltages to be bleed off, and still not interfere with the selecting of word lines when they are taken LOW.

The present invention provides in another embodiment a method of operating a magnetic memory device, the device comprising an array of magnetic memory cells which are connected to wires, the method comprising the steps of selecting wire and limiting a voltage associated with built-up electrical charges of unselected wire.

The step of limiting the voltage may comprise discharging the built-up electrical charges. In this case, the built-up electrical charges may be discharged by directing a discharge current through non-linear current limiting element such as a discharge diode. Further, this step may comprise reverse biasing the diode during a write operation and forward biasing the diode after the write operation to discharge built up electrical charges.

Although the invention has been described with reference to particular examples, those skilled in the art will appreciate that the invention may be embodied in many other forms. For example, the magnetic memory cells may be based on colossal magneto resistance (CMR) or giant magneto resistance memory (GMR) technology.

What is claimed is:

1. A magnetic random access memory (MRAM) comprising:
    an array of magnetic memory cells arranged on a cross-point grid in which each memory cell represents a resistive current path;
    a plurality of bit and word select lines in said cross-point grid connected to address individual ones of said memory cells, and such lines having stray capacitances on which spurious voltages can build up on unselected ones of said lines; and
    a plurality of diodes connected to limit and discharge said spurious voltages on said unselected lines;
    wherein, device operating margins are improved.

2. The MRAM of claim 1, wherein:
    the array of magnetic memory cells has an increased size made possible by said improved device operating margins.

3. The MRAM of claim 1, further comprising:
    a word line decoder connected to the plurality of bit and word select lines and such that unselected ones are high impedance and can build floating voltages that would otherwise disturb said device operating margins.

4. The MRAM of claim 1, wherein:
    the plurality of diodes are individually connected between a common voltage reference and independent ones of the plurality of bit and word select lines, and bleed off excess charges that would otherwise disturb said device operating margins.

5. The MRAM of claim 1, further comprising:
    a plurality of current limiting resistors each in series with individual ones of the plurality of diodes, and the series combinations individually connected between a common voltage reference and the plurality of bit and word select lines, wherein bleed off excess charges are bled off that would otherwise disturb said device operating margins.

6. A magnetic random access memory (MRAM) comprising:
    an array of magnetic memory cells arranged on a cross-point grid wherein each memory cell represents a resistive current path;
    a plurality of word select lines in said cross-point grid connected to address rows of individual ones of said memory cells, and such word lines having stray capacitances on which spurious voltages can build up on unselected ones of said lines; and
    a decoder connected to independently drive each one of the plurality of word select lines between ground and a clamping voltage, and not allowing a high impedance state of any of the plurality of word select lines that would otherwise allow floating voltages to build up and disturb said device operating margins.

7. The MRAM of claim 6, wherein:
    the array of magnetic memory cells has an increased size made possible by said improved device operating margins.

8. The MRAM of claim 6, further comprising:
    a voltage reference connected to the decoder and providing for each word line to assume an equi-potential voltage when not selected.

* * * * *